United States Patent [19]
Hoffman

[11] Patent Number: 6,151,215
[45] Date of Patent: Nov. 21, 2000

[54] SINGLE MOUNT AND COOLING FOR TWO TWO-SIDED PRINTED CIRCUIT BOARDS

[75] Inventor: Scott Hoffman, Basehor, Kans.

[73] Assignee: AlliedSignal Inc., Morristown, N.J.

[21] Appl. No.: 09/369,962

[22] Filed: Aug. 6, 1999

Related U.S. Application Data

[60] Provisional application No. 60/111,716, Dec. 8, 1998.

[51] Int. Cl.[7] ............................................. H05K 7/20
[52] U.S. Cl. ..................... 361/704; 361/690; 361/707; 361/709; 361/719; 361/720; 361/721; 361/730; 361/736; 174/16.3; 165/80.3; 165/104.33; 165/185
[58] Field of Search ................... 361/704, 707, 361/709, 710, 711, 714–721, 728–730, 741, 752, 756; 174/16.1, 16.3; 165/80.3, 135

[56] References Cited

U.S. PATENT DOCUMENTS

| | | | |
|---|---|---|---|
| 4,887,353 | 12/1989 | Preputnick | 361/721 |
| 5,218,516 | 6/1993 | Collins et al. | 361/721 |
| 5,696,668 | 12/1997 | Zenitani et al. | 361/802 |
| 5,754,401 | 5/1998 | Saneinejad et al. | 361/705 |
| 5,892,658 | 4/1999 | Urda et al. | 361/704 |
| 5,949,650 | 9/1999 | Bulante et al. | 361/704 |
| 5,999,407 | 12/1999 | Meschter et al. | 361/704 |

*Primary Examiner*—Leo P. Picard
*Assistant Examiner*—Boris Chervinsky

[57] ABSTRACT

A mounting plate for two printed circuit boards. The mounting plate formed of a layer of thermally conductive material with securing mechanisms fixing one of the two printed circuit boards in a spaced away relationship with each surface of the mounting plate.

29 Claims, 9 Drawing Sheets

SINGLE MOUNT AND COOLING FOR TWO TWO-SIDED PRINTED CIRCUIT BOARDS

This application claims the benefit of U.S. Provisional application Serial No. 60/111,716, filed on Dec. 8, 1998, in the name of Scott Hoffman, the entirety of which is incorporated herein by reference.

BACKGROUND OF THE INVENTION

The invention relates to circuit board assemblies, and more particularly to mounting of double-sided printed circuit boards and the transfer of heat therefrom.

A byproduct of normal operation of an electronic circuit is thermal energy, i.e., heat, generated as the result of frictional effects of charge flow during operation of the electronic circuit. Greater charge flows, i.e., larger currents, generate more thermal energy. A build-up of thermal energy can, if not safely dissipated, cause undesirable operating characteristics in the electronic circuit and can even cause damage to the components of the electronic circuit and components of other nearby circuits. Heat build-up is of particular concern when space is limited, for example, in aircraft cockpits, under automobile dashboards and in other vehicle installations where space is a premium, also in portable and desktop computing and entertainment applications. In such applications, individual circuits are typically packed closely together and the opportunities to cool the circuits are limited.

One approach to dissipating this built-up heat while conserving space has been to mount two single-sided electronic circuit boards on opposing sides of a thermally conductive plate with the components facing outwardly away from the thermally conductive plate. The conductive plate is mounted in the electronics box using wedge locks. The heat generated electrically in the electronic circuits is carried by the thermally conductive mounting plate to the walls of the electronics box which is usually formed with fins on the exterior walls to dissipate the heat into the surrounding atmosphere. However, this approach is limited to less densely populated single-sided electronic circuit boards. Also, the electronic circuit boards with outwardly facing components are difficult to mate with other system components.

As noted above, modern electronics circuits are often installed in aircraft cockpits, under automobile dashboards, in other vehicle installations, and also in portable computing and entertainment applications. Electronics circuits used in these applications are subjected to damaging shock and vibration environments. Thus, another important consideration in the design and manufacture of electronic circuits and their mounting is to minimize susceptibility to applied shocks and vibrations. To that end, manufacturers of these devices typically strive to maximize the resonance amplification factor (Q) of the vibration system, as represented by the electronic circuit and its mounting.

SUMMARY OF THE INVENTION

The present invention overcomes space, heat dissipation and mounting limitations of the prior art by providing a mounting structure capable of absorbing thermal energy or heat from two single-sided or two double-sided printer circuit boards and conducting the heat away from the electronic circuits.

The present invention overcomes the space, heat dissipation and mounting limitations of the prior art by providing a mounting plate for two printed circuit boards formed of a substantially planar layer of thermally conductive material and including one or more securing mechanisms for fixing a printed circuit board in a spaced away relationship to each side of the mounting plate. The mounting plate is preferably formed longer than at least one of the two printed circuit boards such that it can be inserted into slots formed in the walls of an electronics enclosure.

According to one aspect of the present invention, the two printed circuit boards are spaced away from one edge of the mounting plate such that a portion of each of the two printed circuit boards is unsupported or cantilevered relative to the mounting plate. This cantilevered portion carries a connector for coupling the electronic circuit with a mating connector in an electronics enclosure or box.

According to another aspect of the present invention, the mounting plate preferably includes spacers disposed between mounting plate and each of the two printed circuit boards. The two printed circuit boards are fixed to the ends of the spacers. The spacers are affixed to each surface of the mounting plate and are, preferably, integral with the mounting plate.

According to various aspects of the invention, the mounting plate is either formed of a single layer of thermally conductive material or is formed of at least two substantially planar layers of thermally conductive material joined together. Each layer of a mounting plate formed of multiple layers is further formed with fins that project from the side of the layer where it is joined to a second layer.

According to yet another aspect of the present invention, an electronics enclosure is provided for use with the mounting plate formed of multiple layers joined together with fins projecting from the joined together sides. The electronics enclosure preferably includes at least two opposing walls joined in a spaced apart relationship with slots sized to accept the mounting plate formed in each wall and openings or windows formed in the walls adjacent the slots and aligned with the fins of an installed mounting plate.

According to still another aspect of the present invention, a method for dissipating heat generated by two printed circuit boards having heat generating components installed thereon is provided. The preferred method includes orienting a surface of one of the printed circuit boards having the heat generating components installed thereon in a facing relationship with each of two opposing surfaces of a thermally conductive plate; fixing one of the two printed circuit boards in a spaced away relationship with a corresponding one side of the thermally conductive plate; and absorbing heat generated by the components into the thermally conductive plate.

According to one preferred embodiment of the method of the present invention, the heat generating components are spaced away from the mounting plate and a compressible pad of thermally conductive foam or other suitable material is inserted between the heat generating components and the thermally conductive mounting plate to better conduct the generated heat into the mounting plate.

According to a further aspect of the preferred embodiment of the method of the present invention, the thermally conductive plate having the two printed circuit boards secured thereto is installed into an electronics enclosure. The heat absorbed into the mounting plate is conducted through the mounting plate into the walls of the electronics enclosure, thus efficiently dissipating the absorbed heat. According to an aspect of the invention configured of two joined together conductive layers with fins projecting from each layer toward the other layer, the assembly of the mounting plate and the two printed circuit boards is preferably installed into an electronics enclosure having openings, or "windows," formed in the upper and lower walls of the electronics enclosure adjacent the mounting slots and generally aligned with the cooling fins. Thus located, the windows provide access and egress for cooling air and the rise of heated air through the enclosure provides a natural flow of the cooling air past the fins. Alternatively, the windows are formed in the side walls of the electronics enclosure adjacent the mounting slots and generally aligned with the cooling fins.

Accordingly, free-flowing or forced air passes through the window on the bottom or one side of the electronics enclosure, across the cooling fins, and through the window on the top or opposite side of the electronics enclosure, thus dissipating the absorbed heat efficiently.

According to still another aspect of the present invention, the invention overcomes the shock and vibration susceptibility limitations of the prior art by providing a mounting structure capable of maximizing the resonance amplification factor (Q) of the assembly of a mounting plate and two printed circuit boards. Accordingly, the present invention provides a structure and method for stiffening the assembly of a mounting plate and two single-sided or two double-sided printer circuit boards by securing each of the printed circuit boards to opposite sides of the mounting plate in a substantially parallel and spaced away relationship.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention is a mounting device for two single-sided or two double-sided electronic circuit boards, commonly referred to as printed circuit boards or PCBs.

Figure 1:
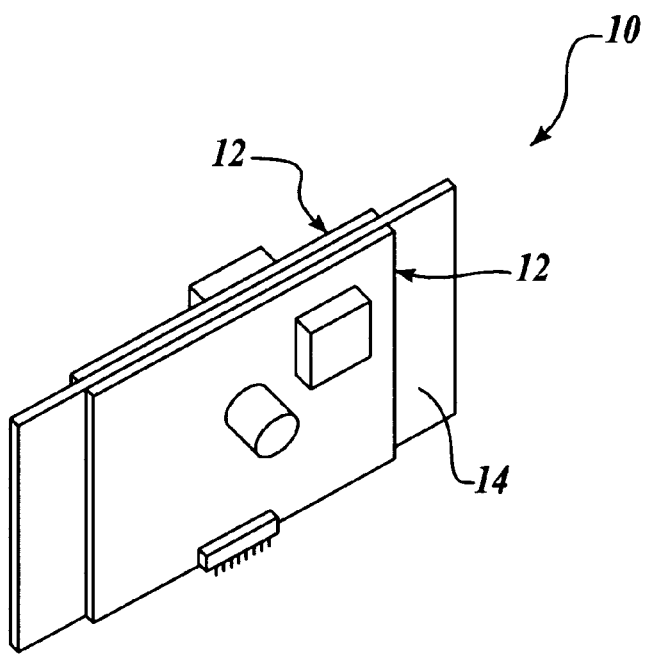
FIG. 1 is a perspective view of the prior art configuration.

FIG. 1 is perspective view of the prior art device for mounting two single-sided printed circuit boards or PCBs. In prior art assembly 10, two single-sided PCBs 12 are bonded to a thermally conductive mounting plate 14 using one of the commercially available thermally conductive bonding agents. Mounting plate 14 is typically formed of aluminum or copper for efficient heat conduction. Single-sided PCBs 12 are mounted with their electronics components facing outward away from one another and away from mounting plate 14, whereby the components are exposed to the atmosphere for cooling. In the prior art device, the components in the current method cool by conduction into the board material of PCBs 12 and thereafter into conductive mounting plate 14 where it is then removed from the design. Thus, the prior art device is limited to use with single-sided PCBs 12.

Figure 2:
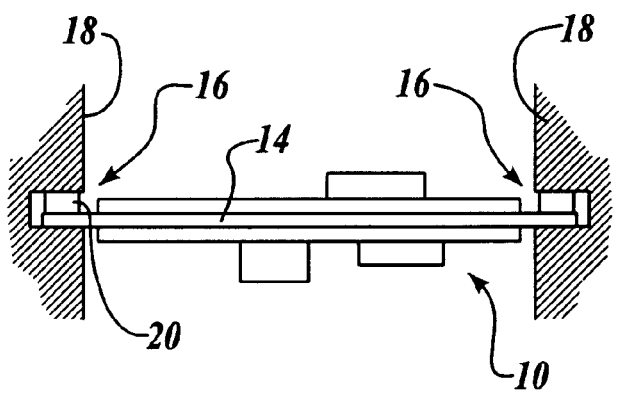
FIG. 2 is an edge view of the prior art configuration shown in FIG. 1 as mounted into an electronics enclosure.

FIG. 2 shows the edge of prior art assembly 10 of FIG. 1 mounted into an electronics box. Mounting plate 14 is fit into slots 16 in the interior walls of electronics box 18 with the outward facing components of each PCB 12 exposed to the ambient cooling air inside the electronics box. Multiple conventional wedge locks 20 clamp assembly 10 relative to electronics box 18 by locking the edges of mounting plate 14 into slots 16. Wedge locks 20 clamp mounting plate 14 into intimate contact with the material of slots 16 such that heat dissipation from mounting plate 14 is by conduction into the walls of electronics box 18. Also, the outwardly facing components interfere with components of other proximately located PCBs during initial installation and radiate heat to those proximately located components during operation.

Figure 3:
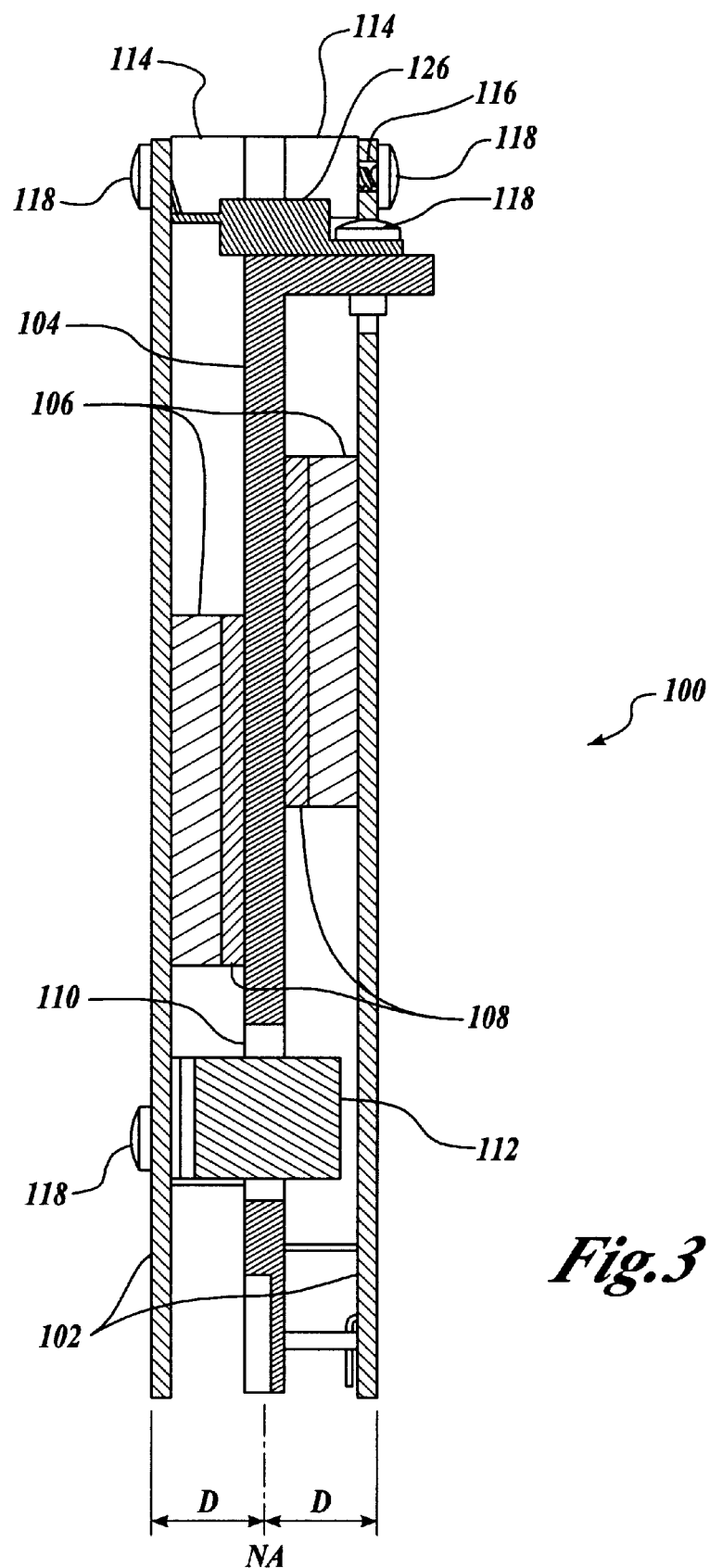
FIG. 3 is a side view of the mounting plate of the present invention in an assembly with two printed circuit boards.

FIG. 3 shows a side view of the mounting device of the present invention for mounting two single-sided or two double-sided printed circuit boards or PCBs.

As shown in FIG. 3, assembly 100 includes two printed circuit boards or PCBs 102 mounted on a heat conducting plate 104 preferably formed of aluminum or copper for efficient heat conduction. Each PCB 102 is mounted with the heat generating components 106 on each PCB 102 facing toward heat conducting plate 104. Each PCB 102 is mounted generally parallel to and spaced away from heat conduction plate 104 to provide room for components 106. A pad of thermally conductive foam 108, such as an AlO2 foam produced by Cromerix™, is placed in the gap formed between heat generating components 106 mounted on PCBs 102 and heat conducting plate 104. Thermally conductive foam 108 transmits heat away from heat generating components 106 on PCBs 102 into heat conducting plate 104. Heat conducting plate 104 is formed of a thermally conductive material, for example, aluminum or copper, and conducts the heat generated by components 106 to the cooler interior walls of an electronics enclosure or box (shown in later Figures). Heat conducting plate 104 optionally includes one or more openings 110 (best shown in FIG. 4) to accommodate components 112 that extend beyond the distance between the respective PCB 102 and the plate 104.

Assembly 100 includes spacers for securing PCBs 102 to heat conduction plate 104 at a fixed distance from the surface of conduction plate 104. In a preferred embodiment, heat conduction plate 104 includes integral spacers 114 formed on each of its opposing faces. Preferably, each spacer 114 is aligned with a mounting hole 116 in PCB 102 and is configured to accept a fastener, for example, a screw 118, whereby each PCB 102 is securely fastened at a predetermined off-set distance to one of the two opposing substantially planar and parallel surfaces of heat conduction plate 104. Those of ordinary skill in the art will recognize that screw 118 is only one of many conventional fasteners by which PCBs 102 may be secured to heat conduction plate 104. For example, PCBs 102 are secured to heat conduction plate 104 by epoxy bonding, nuts and bolts, pins, clips, rivets and other suitable securing mechanism, all of which are contemplated by the present invention. Also, while assembly 100 is illustratively described using integrally formed spacers 114, those of ordinary skill in the art will recognize that such description is not intended to limit the scope of the invention but that other equivalent spacers are similarly contemplated to be within the scope of the invention. For example, spacers 114 are optionally blocks fixed to the surfaces of heat conduction plate 104 by adhesive or epoxy bonding, welding, brazing, soldering, mechanically fastening or anther suitable means; hollow tubes press-fit into recesses or holes in heat conduction plate 104 or captured between each PCB 102 and respective sides of heat conduction plate 104 by the securing fastener; or threaded rods fixed relative to heat conduction plate 104 using nuts, whereby PCBs 102 are secured to heat conduction plate 104 at a predetermined off-set distance using additional nuts spaced along the threaded rods. Thus, the present invention contemplates any suitable device or combination of devices whereby PCBs 102 are secured in a spaced away relationship to heat conduction plate 104.

Assembly 100 of the present invention has substantially improved shock and vibration characteristics over the prior art assembly 10 shown in FIGS. 1–2. In shock and vibration environments, the assemblies of PCBs and the mounting plate of both the prior art device and the present invention are most susceptible to sock and vibration loads applied normal to the plane of the PCBs and the mounting plate. Each the assemblies of both the prior art device and the present invention act essentially as mechanical beams having a stiffness, S, which increases exponentially as a function of distance, D, from the neutral axis, NA, of the mounting plate to the outermost fiber of each PCB. This increasing stiffness effect is most pronounced when the two PCBs are secured to the mounting plate such that the PCBs and the mounting plate act as a unified beam. According to the present invention, spacers 114 greatly increase the distance, D, from the neutral axis of the mounting plate, heat conduction plate 104, to the outermost fiber of each PCB 102. The resulting increase in stiffness results in an improved mechanical resonance amplification factor (Q) of the vibratory system represented by assembly 100 as compared with prior art assembly 10. In other words, the greater stiffness provided by assembly 100 of the present invention results in greater resistance to shock and vibration over the prior art device.

Figure 4:
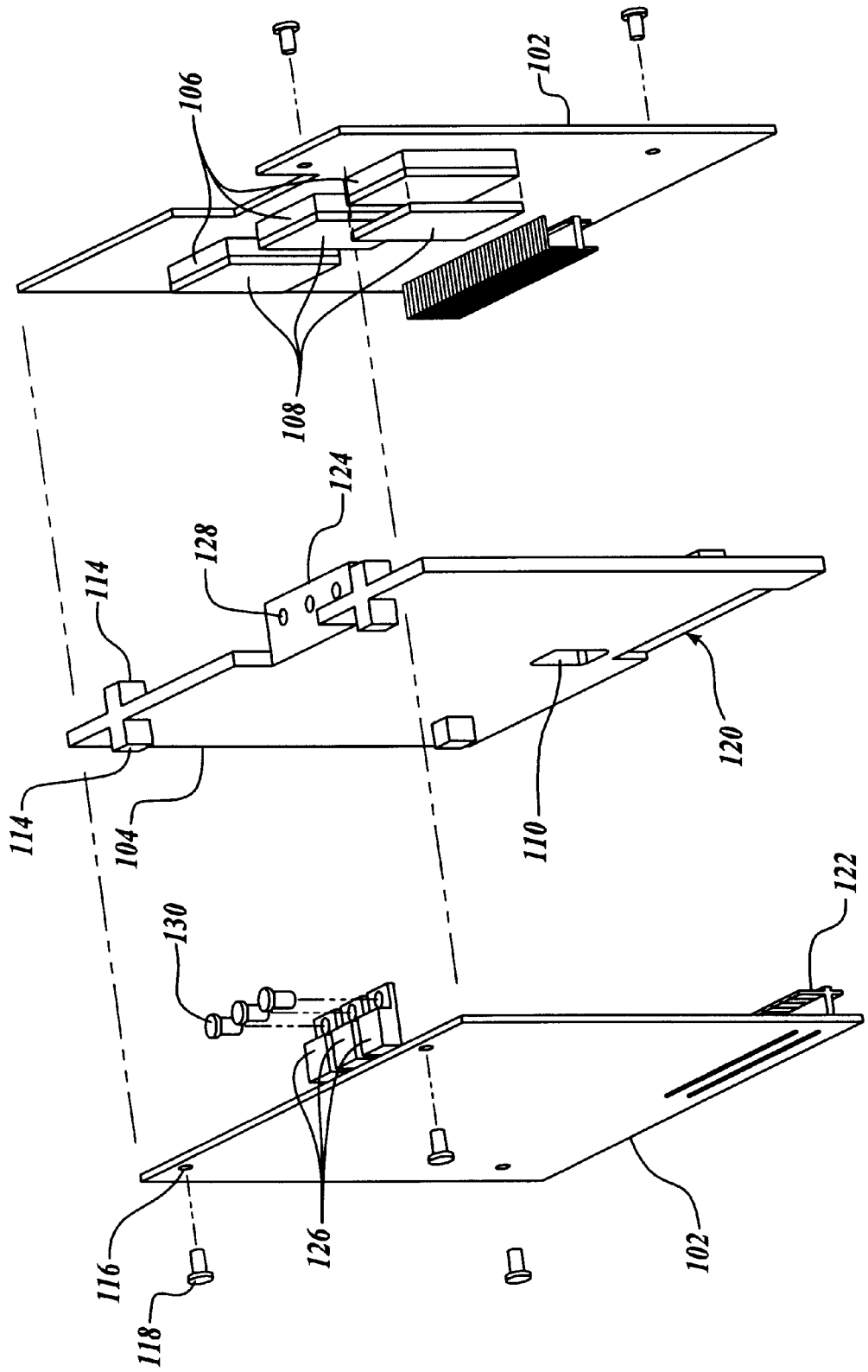
FIG. 4 is an exploded view of the mounting plate and printed circuit board assembly of the present invention shown in FIG. 3.

FIG. 4 shows an exploded view of assembly 100, including a more detailed view of heat conduction plate 104. Heat conduction plate 104 optionally includes other features intended to accommodate features of particular PCBs 102 in particular applications. For example, in addition to optional openings 110 for tall components 112, heat conduction plate 104 optionally includes one or more recess areas 120 extending below the nominal surface of heat conduction plate 104 to accommodate an array of connector pins 122. Heat conduction plate 104 is also optionally formed with one or more mounting blocks 124 to accommodate one or more heat generating transistors 126 on PCBs 102. Mounting block 124 is preferably formed with one or more threaded holes 128 to accommodate screws 130 attaching heat generating transistors 126 thereto.

Figure 5:
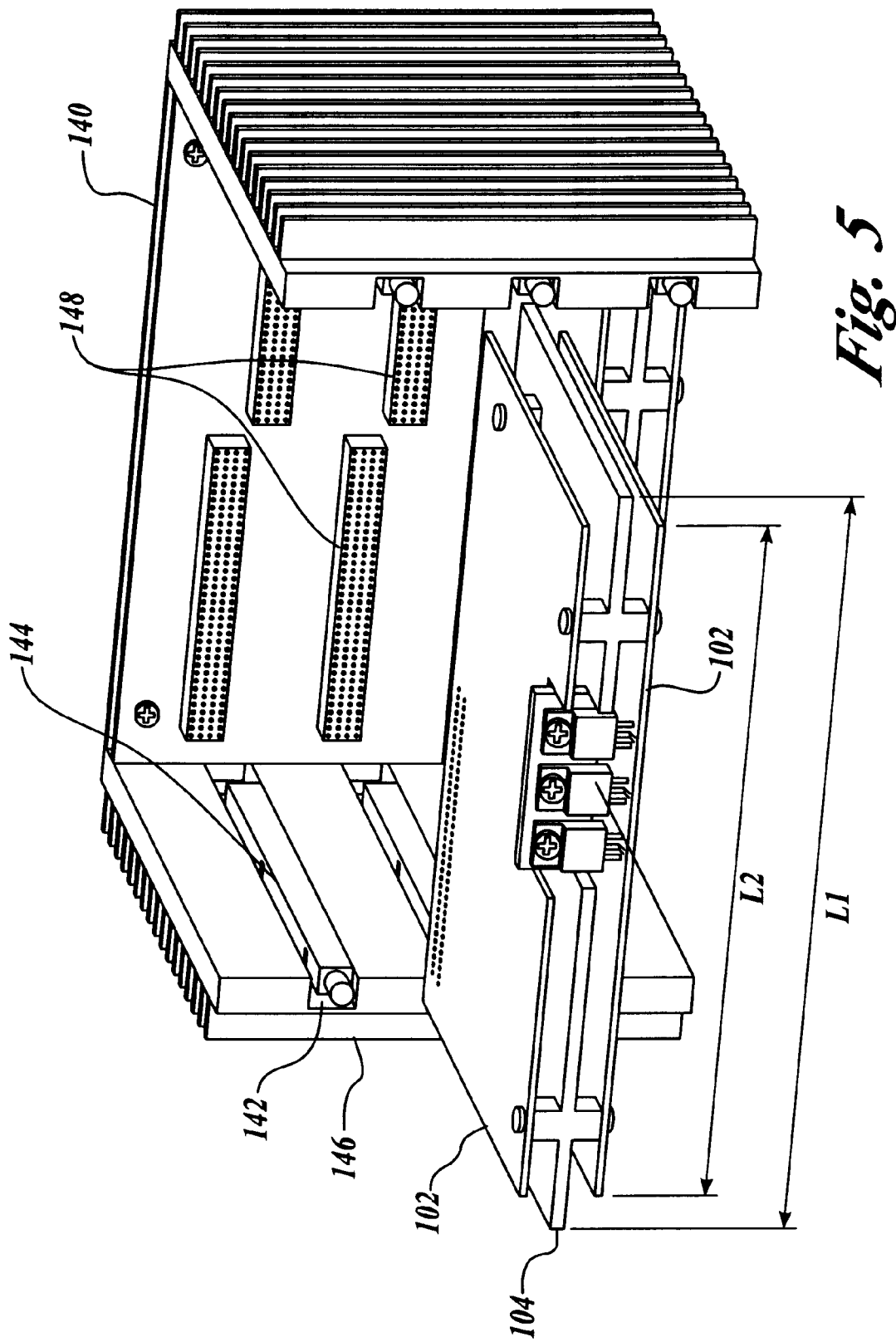
FIG. 5 is a perspective view of an electronics enclosure configured to receive the mounting plate and printed circuit board assembly of the present invention.
Figure 6:
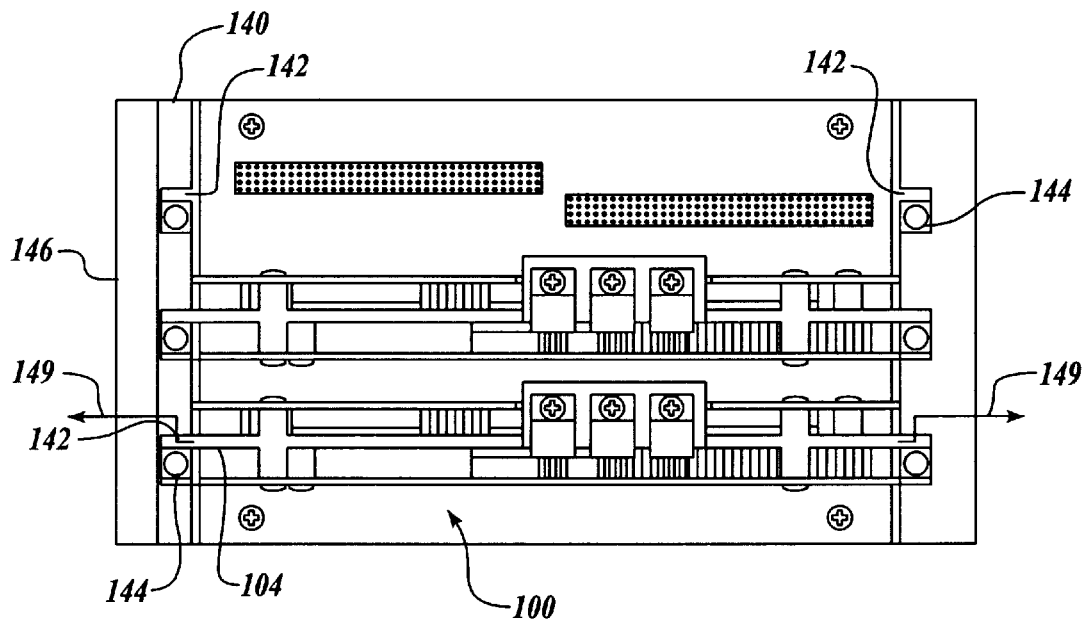
FIG. 6 is an end view of an electronics enclosure having the mounting plate and printed circuit board assembly of the present invention installed therein.

FIGS. 5 and 6 illustrate the embodiment of assembly 100 illustrated in FIGS. 3 and 4 as mounted in an electronics enclosure or box 140. Heat conduction plate 104 is preferably formed having a generally flat shape of dimensions slightly larger than those of PCBs 102 intended to be mounted thereon. In a preferred embodiment, heat conduction plate 104 has a length L1 that extends beyond the length L2 of PCBs 102 sufficiently to fit into slots 142 formed in the interior walls of electronics box 140. Assembly 100 is mounted into electronics box 140 by inserting the end portions of plate 104 exposed by the shorter length L2 of PCBs 102 into slots 142 and securing the end portions to the wall of electronics box 140 with locking devices 144. Installation of assembly 100 into electronics box 140 creates a thermal path for the heat in plate 104 to flow into the walls of electronics box 140 and then into fins 146 mounted or formed on the exterior of the wall or to any other device utilized for dissipating heat. Bus connectors 148 are mounted on one wall of electronics box 140 for electrical coupling with bus connectors 122 (shown in FIG. 4) on each PCB 102.

FIG. 6 shows the thermal path 149 formed between heat conduction plate 104 and fins 146 through the side walls of electronics box 140.

The above embodiment of assembly 100 is described above using two single-sided PCBs, i.e., printed circuit boards having components mounted on only one side. Single-sided PCBs 102 are mounted on heat conduction plate 104 with components 106 facing inwardly. In this configuration, only the relatively smooth surfaces of the backs of PCBs 102 face outwardly so that during installation components 106 do not interfere with components on other already installed boards or the interior of electronics box 140. Also, inwardly facing components 106 do not radiate heat toward those proximately located components on other PCBs during operation. However, according to one preferred embodiment, assembly 100 is configured using two double-sided PCBs 102, wherein each PCB 102 includes components 106 mounted on both opposing surface of the circuit board structure. Generally, twice as much circuit density is possible using double-sided PCBs in place of single-side PCBs. Accordingly, fewer assemblies 100 having two double-sided PCBs 102 are required to fulfill the same functions as are required using two single-sided PCBs 102. One result of the greater circuit density using double-sided PCBs 102 is fewer, usually half as many, wedge locks are 144 are used to secure assemblies 100 in electronics box 140. As mentioned above, wedge locks tend to restrict dissipation of heat into the walls of the electronics box. Therefore, an assembly using fewer wedge locks dissipates heat with significantly greater efficiency as compared with an assembly using more wedge locks. Also, the reduced number of wedge locks results in reduced material costs. More efficient heat dissipation ensures satisfactory operation of the electronics circuit while avoiding undesirable operating characteristics and damage to components of the electronic circuit and components of other nearby circuits possible with the prior art device.

Also, whether assembly 100 includes either single-sided or double-sided PCBs 102, as discussed above, the resulting assembly 100 has substantially improved shock and vibration reliability over the prior art device.

Figure 7:
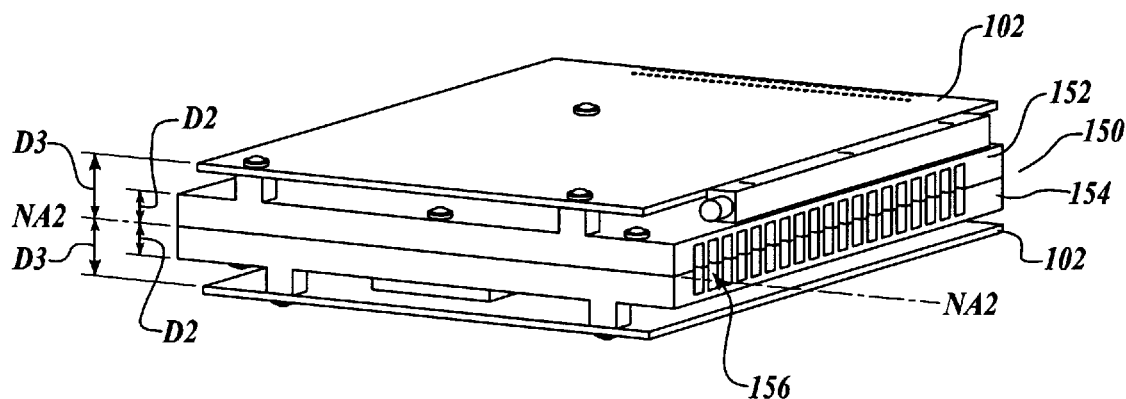
FIG. 7 is a perspective view of an alternate embodiment of the mounting plate of the present invention in an assembly with two printed circuit boards.
Figure 8:
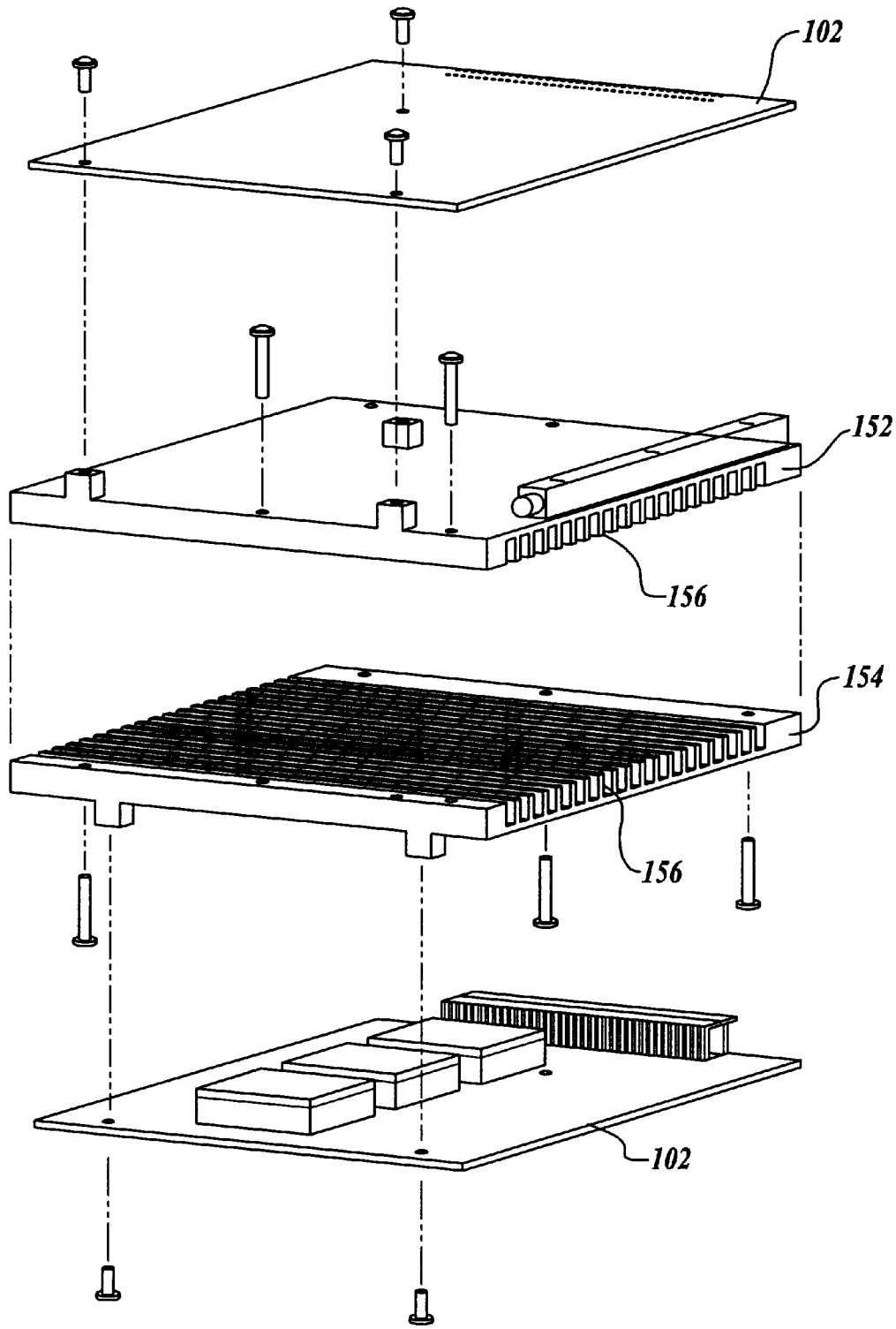
FIG. 8 is an exploded view of the alternate embodiment mounting plate and printed circuit board assembly of the present invention shown in FIG. 7.

FIGS. 7–10 illustrate an alternate embodiment for the heat conducting plate of the present invention that mounts two single-sided or two double-sided printed circuit boards, or PCBs, and inserts into the electronics box. As shown in FIGS. 7 and 8, the heat conducting plate 150 includes an upper section 152 and a lower section 154, preferably formed of aluminum or copper for efficient heat conduction. Each of upper and lower sections 152 and 154 includes an inner side and an outer side. The outer side of each upper and lower section 152 and 154 supports either a single-sided or a double-sided PCB 102 in a spaced away and essentially parallel relationship. As described above in connection with FIGS. 3–4, the supports for each PCB 102 are preferably spacers securing PCBs 102 to the outer side of each upper and lower sections 152 and 154 at a fixed distance from the respective outer surfaces. In a preferred embodiment, the outer side of each upper and lower section 152 and 154 includes integrally formed spacers. Preferably, each spacer is aligned with a mounting hole in PCB 102 and is configured to accept a fastener, for example, a screw, whereby each PCB 102 is securely fastened at a predetermined off-set distance to one of the opposing outer sides of upper and lower sections 152 and 154. The inner side of each upper and lower section 152 and 154 includes a collection of fins 156. In a preferred embodiment, upper and lower sections 152 and 154 are secured to each other, for example, by fasteners, in a relationship having fins 156 on the inner sides of upper and lower sections 152 and 154 oppose each other. Heat generated by components mounted on the PCBs 102 flows into the heat conducting plate sections 152 and 154 then passes to the fins 156.

The resulting assembly of opposing upper and lower sections 152 and 154 of the present invention has substantially improved shock and vibration characteristics over the prior art assembly 10 shown in FIGS. 1–2 for withstanding shock and vibration loads applied normal to the plane of the PCBs and the mounting plate. Mated and secured upper and lower sections 152 and 154 form an essentially unified mechanical beam structure having a neutral axis, NA2, defined by the mating plane. The outer surfaces of each upper and lower section 152 and 154 provide the beam structure with a stiffness, S2, which is an exponential function of the distance, D2, from the neutral axis, NA2, of the mounting plate to the surfaces of the outer sides of each upper and lower section 152 and 154. The assembly of two PCBs 102 at a distance, D3, from the neutral axis, NA2, causes an additional increase in the stiffness, S2. The increased stiffness provides an improved mechanical resonance amplification factor (Q) of the vibratory system as compared with prior art assembly 10, whereby the assembly of the present invention has greater resistance to shock and vibration over the prior art device.

Figure 9:
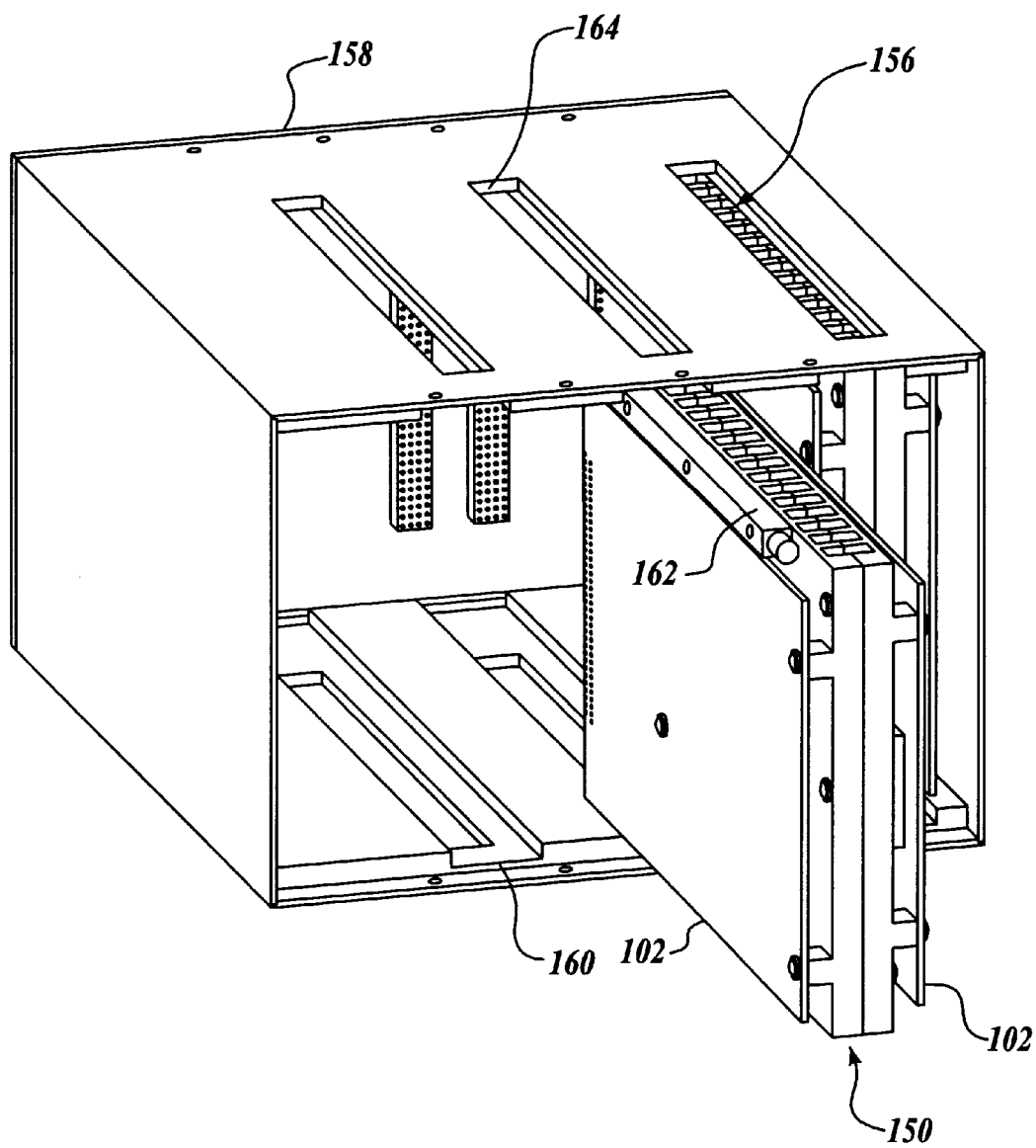
FIG. 9 is a perspective view of an electronics enclosure configured to receive the alternate embodiment mounting plate and printed circuit board assembly of the present invention shown in FIG. 7.
Figure 10:
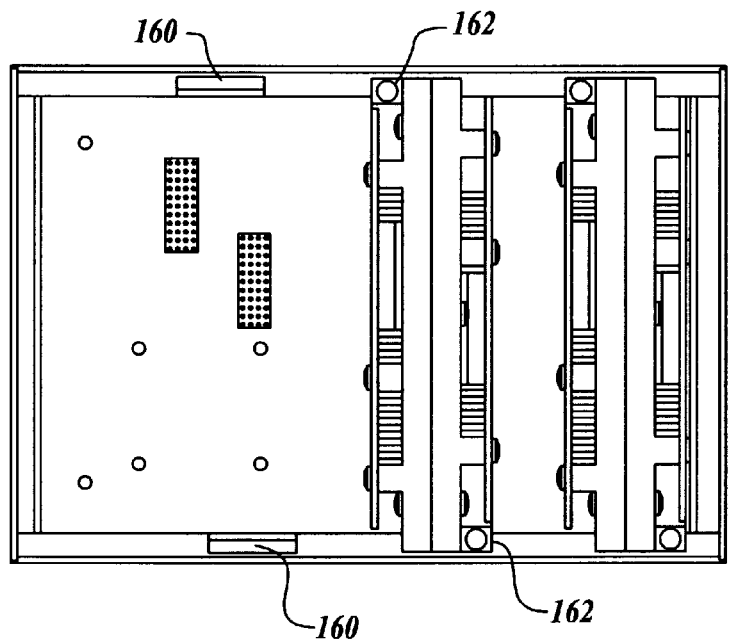
FIG. 10 is an end view of an electronics enclosure having the alternate embodiment mounting plate and printed circuit board assembly of the present invention shown in FIG. 7 installed therein.

FIGS. 9 and 10 illustrate an exemplary electronics box 158 according to the present invention configured to receive the single heat conducting mount 150 for two single-sided or two double-sided printed circuit boards or PCBs 102 shown in FIGS. 7 and 8. Box 158 includes one or more slots 160 formed on the inside of the box 158 for receiving the plate 150 with mounted PCBs 102. Locking clamps 162 secure heat conduction plate 150 within slots 160. Locking clamps 162 are optionally mounted to one of upper and lower sections 152, 154 of the plate 150 or are mounted within slots 160. Box 158 also includes openings or windows 164 that allow forced or unforced cooling air to pass through fins 56 of the heat conducting plate sections 152 and 154 when they are secured within box 158. This cooling air flow removes heat from upper and lower heat conduction plates 152 and 154 by cooling fins 156. In contrast to the electronics box of the prior art and electronics box 140 of FIG. 5, electronics box 158 does not have externally mounted fins. Rather, fins 156 of the sections 152 and 154 provide the required heat dissipation.

Figure 11:
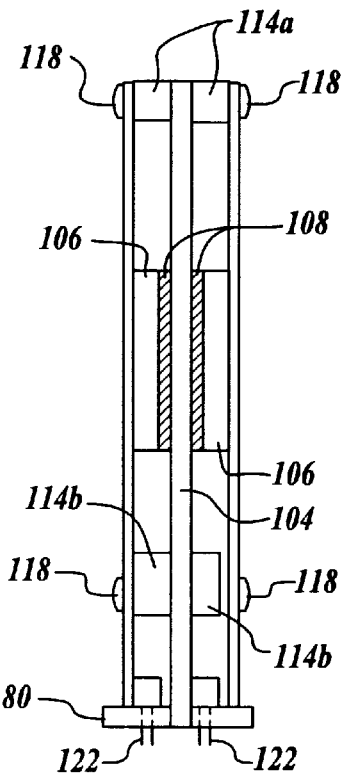
FIGS. 11–14 are side views of still another embodiment of the present invention wherein the printed circuit boards are assembled in a partially unsupported or cantilevered relationship with the mounting plate.
Figure 12:
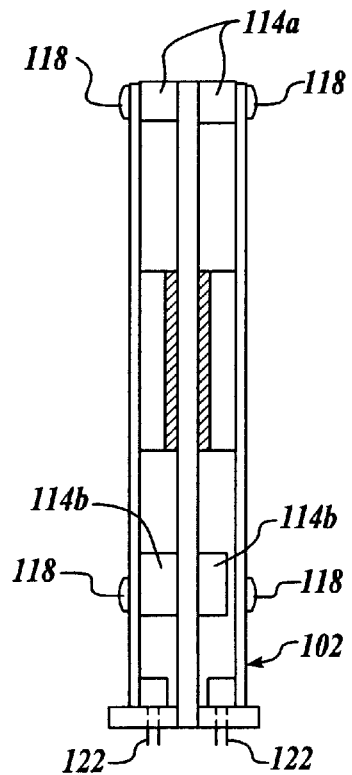

FIGS. 11 and 12 illustrate an embodiment of the present invention wherein each PCB 102 is secured to a pair of upper spacers 114a and a pair of lower spacers 114b on heat conduction plate 104 by a securing mechanism 118, such as a screw, pin, clip, rivet, adhesive, epoxy or another suitable securing mechanism as described above. Upper spacers 114a are preferably positioned essentially flush with the top edge of the plate 104 at a length approximately equal to the length L2 (shown in FIG. 5) of PCBs 102. Lower spacers 114b (only one shown) are positioned at approximately the same length positions of upper spacers 114a, but are mounted recessed or spaced away from the bottom edges of PCBs 102. Spacing lower spacers 114b away from the bottom edges of PCBs 102 ensures that the portion of each PCB 102 extending beyond or below lower spacers 114b is to float free, thereby compensating for positional tolerances of bus connectors 122 relative to the mating connectors on a mother PCB. FIG. 12 illustrates that the lower portions of each PCB 102 has sufficient unsupported length flex into a mating relationship with a receiving device.

Figure 13:
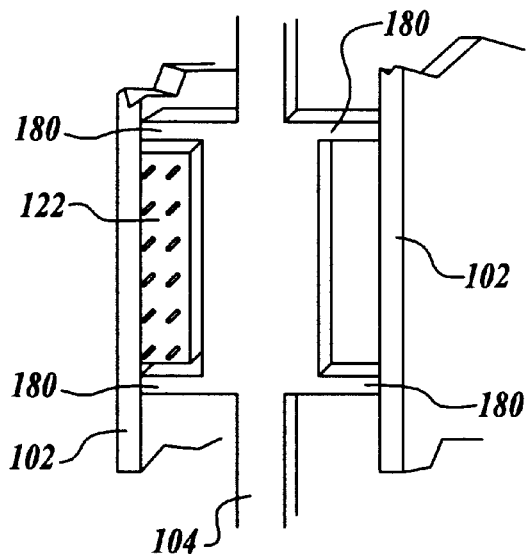
Figure 14:
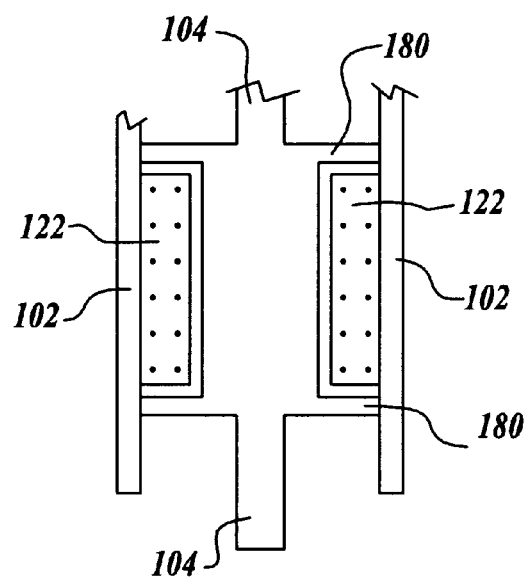

An optional metal shroud 80 is extended from heat conduction plate 104 around PCB bus connectors 122 located at the bottom edge of each PCB 102 assists in mating each bus connector 122 with a mating connector in electronics box 158, on a mother PCB or on any other device by aligning each PCB 102 during installation. FIGS. 13–14 illustrate optional metal shroud 80 in greater detail.

While preferred embodiments of the invention have been described, variations and modifications will be obvious to those of ordinary skill in the relevant art. For example, each PCB 102 is optionally secured to heat conduction plate 104 or 50 at multiple positions along its length L2 for additional rigidity and a corresponding increase in the resonance amplification factor (Q) of the assembly. In another example, the invention is equally applicable for use with an electrical box configured such that one of the two PCBs is able to extend beyond the end of the mounting plate such as in a box designed with mounting slots formed on interior walls which are not coextensive with the exterior walls forming the box or in a box designed with an "L" shape and one of the mounting slots is formed at the intersection of the two perpendicularly adjacent walls. As suggested, the invention also has applications to many computing and entertainment applications where circuits are closely packed in limited space and the opportunities to cool the circuits are limited. For at least these reasons, the invention is to be interpreted in light of the claims and is not limited to the particular embodiments described herein.

What is claimed is:

1. A mounting plate for two printed circuit boards, the mounting plate comprising:
    a layer of thermally conductive material having first and second substantially planar surfaces disposed substantially parallel to each other; and
    at least one securing mechanism coupling the two printed circuit boards to said layer of thermally conductive material, wherein at least one of the printed circuit boards is fixed in a spaced away relationship with each of said first and second planar surfaces.

2. The mounting plate recited in claim 1, wherein at least one said securing mechanism further comprises a spacer disposed between one of said first and second planar surfaces and one of the two printed circuit boards.

3. The mounting plate recited in claim 2, wherein said layer of thermally conductive material has a length dimension L1 greater than a length dimension L2 corresponding to at least one of the two printed circuit boards.

4. The mounting plate recited in claim 3, wherein at least one said securing mechanism fixes the two printed circuit boards at interior positions with respect to one edge of said layer of thermally conductive material, whereby a portion of each of the two printed circuit boards is secured in a cantilevered relationship with said layer of thermally conductive material.

5. The mounting plate recited in claim 4, wherein each said spacer is affixed to each of said first and second planar surfaces.

6. The mounting plate recited in claim 5, wherein each said spacer is integral with said layer of thermally conductive material.

7. The mounting plate recited in claim 4, wherein said layer of thermally conductive material further comprises a plurality of layers of thermally conductive material joined together at said first planar surfaces; and
wherein said securing mechanism fixes at least one of the printed circuit boards in a spaced away relationship with each of said second planar surfaces.

8. The mounting plate recited in claim 7, wherein each said layer of thermally conductive material further comprises a plurality of fins projecting from said first planar surface.

9. A mounting plate for two printed circuit boards, the mounting plate comprising:
a plate formed of thermally conductive material, said plate having opposing substantially planar surfaces disposed substantially parallel to each other and a length dimension L1 greater than a length dimension L2 corresponding to at least one of the two printed circuit boards;
a plurality of spacers disposed on each of said opposing planar surfaces, each said spacer having a distal end spaced a predetermined distance away from a respective one of said opposing planar surfaces; and
at least one securing mechanism coupling the two printed circuit boards to said distal end of said spacers on each side of said layer of thermally conductive material, whereby at least one of the two printed circuit boards is fixed in a spaced away relationship with each of said opposing planar surfaces.

10. The mounting plate recited in claim 9, wherein said securing mechanisms fix the two printed circuit boards at interior positions spaced away from an edge of said plate, whereby a portion of each of the two printed circuit boards is secured in a cantilevered relationship with said plate.

11. The mounting plate recited in claim 10, wherein said spacers are integral with said plate.

12. The mounting plate recited in claim 10, wherein:
said plate further comprises at least two plates of thermally conductive material having first and second substantially planar surfaces disposed substantially parallel to each other and a length dimension L1 greater than a length dimension L2 corresponding to at least one of the two printed circuit boards, said plates joined together at said first planar surfaces;
said spacers project from each of said second planar surfaces; and
said one or more securing mechanisms fix at least one of the two printed circuit boards in a spaced away relationship with each of said second planar surfaces.

13. The mounting plate recited in claim 12, wherein each said plate further comprises a plurality of fins formed of said of thermally conductive material and projecting from said first planar surface.

14. An electronic circuit assembly comprising:
A heat conducting mounting plate having substantially planar opposing surfaces disposed substantially parallel to each other;
two printed circuit boards disposed in a spaced away and essentially parallel relationship with each of said planar surfaces; and
at least one securing mechanism coupling said printed circuit boards in said relationship with each of said planar surfaces.

15. The electronic circuit assembly recited in claim 14, wherein each said securing mechanism further comprises a spacing mechanism disposed between one of said planar surfaces and one of said printed circuit boards.

16. The electronic circuit assembly recited in claim 15, wherein said mounting plate has a length dimension L1 greater than a length dimension L2 corresponding to at least one of said printed circuit boards.

17. The electronic circuit assembly recited in claim 16, wherein each said securing mechanism fixes the two printed circuit boards at interior positions with respect to one edge of said mounting plate, whereby a portion of each of said printed circuit boards is secured in a cantilevered relationship with said mounting plate.

18. The electronic circuit assembly recited in claim 17, wherein said mounting plate further comprises two thermally conductive mounting plates having first and second substantially planar opposing surfaces disposed substantially parallel to each other, said mounting plates joined together at said first planar surfaces; and at least one
said securing mechanism fixes at least one of said printed circuit boards in a spaced away relationship with each of said second planar surfaces.

19. The electronic circuit assembly recited in claim 18, wherein each said thermally conductive mounting plates further comprises a plurality of thermally conductive fins projecting from said first planar surface.

20. A method for dissipating heat generated by two printed circuit boards having one or more heat generating components installed thereon, the method comprising the steps of:
orienting a surface of one of the printed circuit boards having one or more heat generating components installed thereon in a facing relationship with one of two substantially planar opposing surfaces of a thermally conductive plate; and
fixing the two printed circuit boards to said thermally conductive plate surfaces, wherein at least one of the printed circuit boards is fixed in a spaced away relationship with a corresponding one of said two planar opposing surfaces
such that generated heat is absorbed from the printed circuit boards into said thermally conductive plate.

21. The method recited in claim 20, wherein said step of fixing the two printed circuit boards to said thermally conductive plate further comprises disposing a pad of thermally conductive foam between the one or more heat generating components and said thermally conductive plate.

22. The method recited in claim 21, wherein said step of fixing at least one of the two printed circuit boards in a spaced away relationship with a corresponding one of said two planar opposing surfaces further comprises disposing a spacing mechanism between one of the printed circuit boards and one of said planar opposing surfaces.

23. The method recited in claim 22, wherein said step of fixing at least one of the two printed circuit boards in a spaced away relationship with a corresponding one of said two planar opposing surfaces further comprises securing one of the printed circuit boards to a plurality of said spacing mechanisms disposed on each of said planar opposing surfaces.

24. The method recited in claim 23, wherein said step of fixing at least one of the two printed circuit boards in a spaced away relationship with a corresponding one of said two planar opposing surfaces further comprises forming said spacing mechanisms integrally with said thermally conductive plate.

25. The method recited in claim 23, wherein:
said thermally conductive plate is formed of two thermally conductive plates having first and second substantially planar opposing surfaces disposed substantially parallel to each other, said thermally conductive plates joined together at said first planar surfaces;
said step of orienting a surface of one of the printed circuit boards further comprises orienting a surface of one of the printed circuit boards having one or more heat generating components installed thereon in a facing relationship with one of said second planar surfaces; and
said step of fixing one of the two printed circuit boards in a spaced away relationship with a corresponding one of said two planar opposing surfaces further comprises fixing one of the two printed circuit boards in a spaced away relationship with a corresponding one of said second planar surfaces.

26. The method recited in claim 25, wherein each of said thermally conductive plates includes one or more heat conducting fins formed at said first planar surfaces, whereby
absorbed heat is conducted from said thermally conductive plate to said heat conducting fins.

27. The method recited in claim 26, further comprising a step of installing said thermally conductive plate in an electronics enclosure having air passages formed therein and aligning said heat conducting fins with said air passages.

28. The method recited in claim 23, further comprising a step of
thermally coupling one or more peripheral edges of said thermally conductive plate to an electronics enclosure whereby heat is absorbed into said electronics enclosure.

29. An electronics enclosure for use with a thermally conductive mounting plate formed of two thermally conductive plates joined together at first substantially planar surfaces having fins projecting therefrom and having two printed circuit boards fixed in a spaced away relationship with second opposing substantially planar surfaces, the electronics enclosure comprising:
at least two opposing walls joined in a spaced apart relationship;
slots formed in said walls, said slots sized to accept the thermally conductive mounting plate; and
windows formed in said walls adjacent said slots and aligned with the fins of an installed thermally conductive mounting plate.

* * * * *